(12) United States Patent
Nozawa et al.

(10) Patent No.: US 12,041,711 B2
(45) Date of Patent: Jul. 16, 2024

(54) COMMUNICATION DEVICE

(71) Applicant: Sony Interactive Entertainment Inc., Tokyo (JP)

(72) Inventors: Tetsufumi Nozawa, Tokyo (JP); Takatoshi Tsujikawa, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 17/802,697

(22) PCT Filed: Mar. 9, 2021

(86) PCT No.: PCT/JP2021/009292
§ 371 (c)(1),
(2) Date: Aug. 26, 2022

(87) PCT Pub. No.: WO2021/187241
PCT Pub. Date: Sep. 23, 2021

(65) Prior Publication Data
US 2023/0101925 A1 Mar. 30, 2023

(30) Foreign Application Priority Data
Mar. 19, 2020 (JP) .................................. 2020-049720

(51) Int. Cl.
*H05K 1/00* (2006.01)
*H05K 1/02* (2006.01)
(52) U.S. Cl.
CPC ... *H05K 1/0243* (2013.01); *H05K 2201/1006* (2013.01); *H05K 2201/10189* (2013.01)

(58) Field of Classification Search
CPC ......... H05K 1/0243; H05K 2201/1006; H05K 2201/10189
See application file for complete search history.

(56) References Cited

U.S. PATENT DOCUMENTS 7,295,087 B2  11/2007  Tomonari
8,957,746 B2   2/2015  Takahashi
(Continued)

FOREIGN PATENT DOCUMENTS

CN     1707871 A    12/2005
CN   102637924 A     8/2012
(Continued)

OTHER PUBLICATIONS

JP 2009135760A; English Translation; published in 2009 (Year: 2009).*

(Continued)

*Primary Examiner* — Pete T Lee
(74) *Attorney, Agent, or Firm* — Matthew B. Dernier, Esq

(57) ABSTRACT

A communication device includes a communication connector, a communication control circuit, and a common mode filter. The communication control circuit controls communication that is established by way of the communication connector. The common mode filter is connected to each of the communication control circuit and the communication connector to relay the communication. Letting a wavelength corresponding to a clock frequency of an electric signal sent out from the communication control circuit be denoted as $\lambda$, an electrical length of a signal path at which resonance is produced by a reflected wave resulting from reflection of the electric signal by the common mode filter is closer to an even multiple of $\lambda/2$ than to an odd multiple thereof.

4 Claims, 3 Drawing Sheets

(56) References Cited

U.S. PATENT DOCUMENTS

| | | | |
|---|---|---|---|
| 10,630,335 B2 | 4/2020 | Saiton | |
| 2005/0270117 A1* | 12/2005 | Tomonari | H04L 25/0272 |
| | | | 333/17.3 |
| 2012/0194291 A1* | 8/2012 | Pajovic | H01P 1/2005 |
| | | | 333/185 |
| 2012/0206218 A1 | 8/2012 | Takahashi | |
| 2014/0376659 A1 | 12/2014 | Saito | |
| 2018/0048094 A1* | 2/2018 | Cornelius | H01R 13/6473 |
| 2018/0145716 A1* | 5/2018 | Saito | H04B 15/04 |

FOREIGN PATENT DOCUMENTS

| | | | | |
|---|---|---|---|---|
| CN | 108092641 A | 5/2018 | | |
| JP | 8115820 A | 5/1996 | | |
| JP | 2009089129 A | 4/2009 | | |
| JP | 2009135760 A | 6/2009 | | |
| JP | 2012010175 A | 1/2012 | | |
| JP | 2015008354 A | 1/2015 | | |
| JP | 2018085554 A | 5/2018 | | |
| WO | 2006098076 A1 | 9/2006 | | |
| WO | 2009044682 A1 | 4/2009 | | |
| WO | WO-2017048232 A1 * | 3/2017 | | H05K 1/0298 |
| WO | 2018173263 A1 | 9/2018 | | |

OTHER PUBLICATIONS

CN 108463048B; filed on Feb. 14, 2018; English Translation (Year: 2018).*

WO 2017/048232 A1; published in 2017 (Year: 2017).*

JP2009135760 English Translation (Year: 2019).*

International Search Report for corresponding PCT Application No. PCT/JP2021/009292, 5 pages, dated Apr. 27, 2021.

Office Action for corresponding JP Application No. 2022-508241, 10 pages, dated Nov. 17, 2023.

Extended European Search Report for corresponding EP Application No. 21772533, 9 pages, dated Mar. 20, 2024.

The First Office Action for corresponding CN Application No. 202180011292.7, 14 pages, dated Mar. 30, 2024.

* cited by examiner

COMMUNICATION DEVICE

TECHNICAL FIELD

The present invention relates to a communication device that has a built-in printed circuit board to which a communication connector and a control circuit thereof are mounted.

BACKGROUND ART

Wired connection communication standards such as High-Definition Multimedia Interface (HDMI) (registered trademark) 2.1 for data communication with an external communication device at an extremely high-speed clock frequency have come along in recent years.

SUMMARY

Technical Problem

Occurrence of noise (unwanted electromagnetic emission) associated with communication becomes a problem in a communication device that engages in communication at a high-speed clock frequency as described above. There is a case where a common mode filter is arranged between an integrated circuit (communication control circuit) that sends and receives communication signals and a communication connector, as part of a countermeasure against noise. However, full examination is yet to be made as to how the common mode filter should be arranged.

The present invention has been made in light of the above circumstances, and it is an object thereof to provide a communication device capable of effectively suppressing occurrence of noise in a case where communication with an external communication device is carried out by using wired connection by way of a communication connector.

Solution to Problem

A communication device according to the present invention includes a communication connector, a communication control circuit, and a common mode filter. The communication control circuit controls communication that is established by way of the communication connector. The common mode filter is connected to each of the communication control circuit and the communication connector to relay the communication. Letting a wavelength corresponding to a clock frequency of an electric signal sent out from the communication control circuit be denoted as $\lambda$, an electrical length of a signal path at which resonance is produced by a reflected wave resulting from reflection of the electric signal by the common mode filter is closer to an even multiple of $\lambda/2$ than to an odd multiple thereof.

DESCRIPTION OF EMBODIMENT

A detailed description will be given below of an embodiment of the present invention on the basis of drawings.

Figure 1:
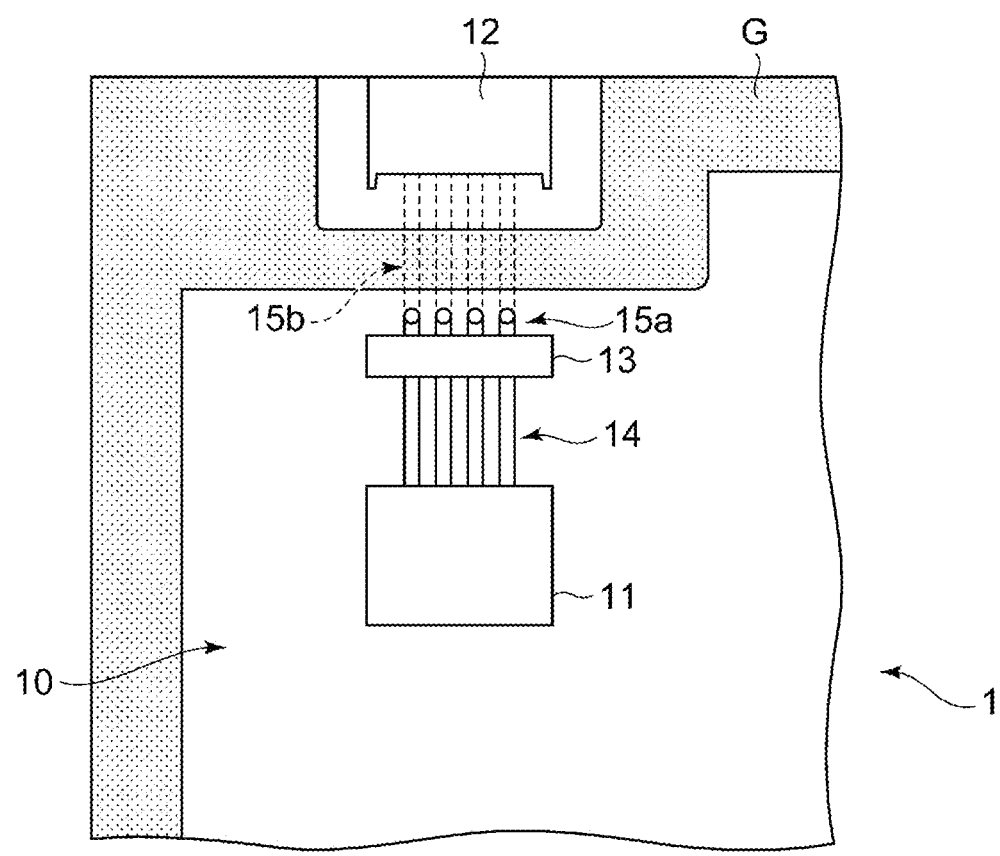
FIG. 1 is a partial plan view of a built-in printed circuit board of a communication device according to an embodiment of the present invention.
Figure 2:
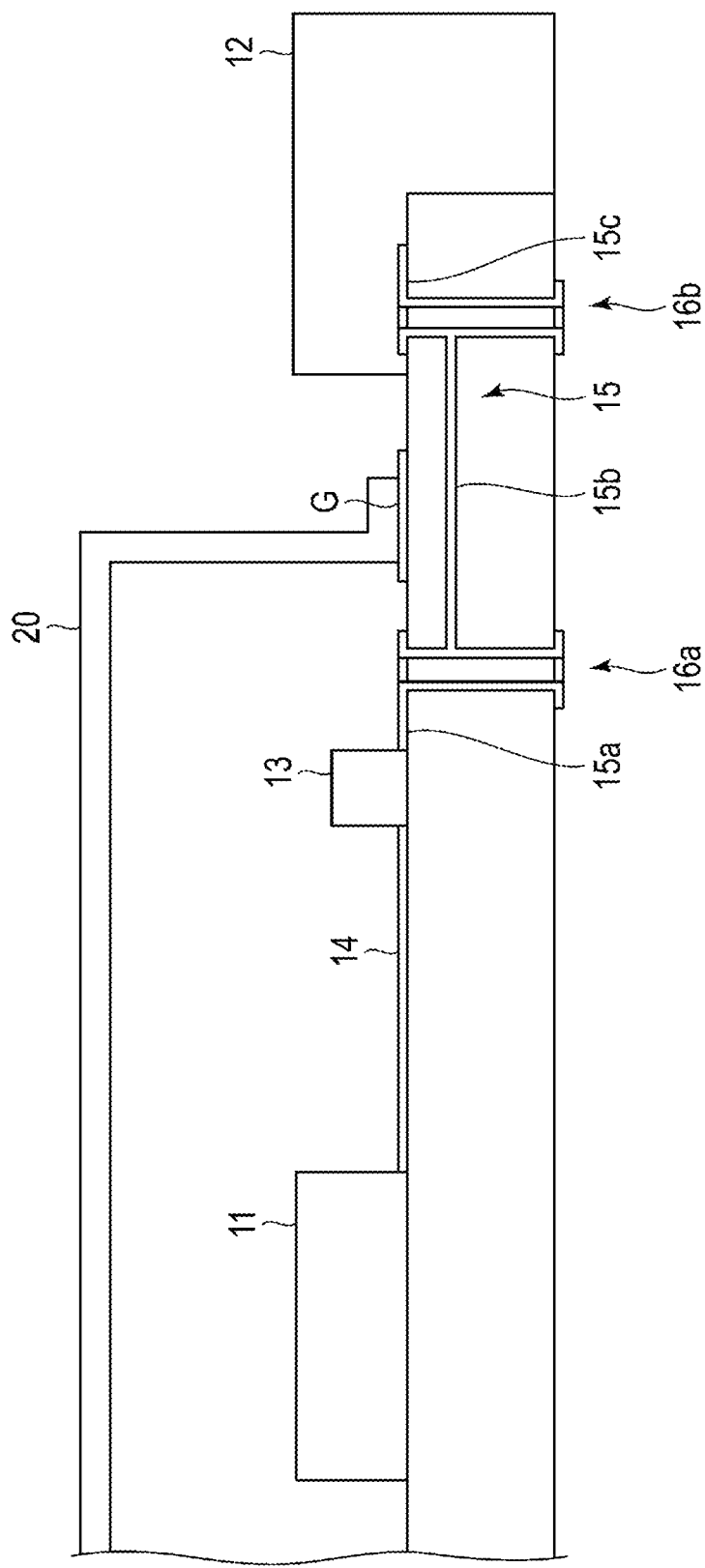
FIG. 2 is a partial sectional view of the built-in printed circuit board of the communication device according to the embodiment of the present invention.

FIG. 1 is a schematic partial plan view of a built-in printed circuit board 10 of a communication device 1 according to an embodiment of the present invention. Also, FIG. 2 is a schematic partial sectional view of the printed circuit board 10. The communication device 1 is an electronic device such as a home gaming machine and includes the printed circuit board (printed wiring board) 10, a communication control circuit 11 mounted to the printed circuit board 10, a communication connector 12, and a common mode filter (CMF) 13 as illustrated in FIG. 1. Also, a shielding member 20 is arranged on a front surface of the printed circuit board 10 in such a manner as to cover the communication control circuit 11 as illustrated in FIG. 2. It should be noted that the shielding member 20 is not illustrated in FIG. 1.

Various circuit elements required for operation of the communication device according to the present embodiment are mounted to the printed circuit board 10. In the present embodiment, it is assumed that the printed circuit board 10 is a multilayer circuit board that has a signal layer (inner layer) not only on the front surface thereof but also on the inside thereof. A ground pattern G which is used as a reference potential of an electronic circuit provided on the printed circuit board 10 is formed on the front surface of the printed circuit board 10. In FIG. 1, the ground pattern G is illustrated as being hatched.

The communication control circuit 11 is an integrated circuit that controls data communication carried out with an external communication device by way of the communication connector 12. Specifically, the communication control circuit 11 generates and outputs an electric signal to be sent out to an external communication device by way of the communication connector 12. The communication control circuit 11 sends an electric signal at a predetermined clock frequency in accordance with a predetermined communication standard. It is assumed here, as a specific example, that the communication control circuit 11 sends an electric signal, obtained by encoding video data, audio data, and the like, to an external communication device in accordance with HDMI 2.0 and HDMI 2.1 standards. It is also assumed that the communication control circuit 11 sends an electric signal at a clock frequency of 8 GHz at most. It should be noted that, although mainly transmitting data in the present embodiment, the communication control circuit 11 may, in addition, receive data transmitted from an external communication device. It should be noted, however, that it is assumed that an average data volume transmitted from the communication control circuit 11 to an external communication device is larger than that received from an external device.

The communication connector 12 is arranged on an outer edge of the printed circuit board 10, and a communication cable supporting the communication standard thereof is connected thereto. The communication device 1 is connected to an external communication device in a wired manner through the communication cable to engage in data communication.

The common mode filter 13 is arranged between the communication control circuit 11 and the communication connector 12 to relay communication between the communication control circuit 11 and the communication connector 12. That is, the communication control circuit 11 and the communication connector 12 are not directly connected by printed wiring and are each connected to the common mode filter 13 through a signal line. The common mode filter 13 reduces common mode noise at a specific frequency included in a relayed electric signal. It should be noted, however, that the common mode filter 13 does not need to reduce common mode noise of signals at all clock frequencies transmitted from the communication control circuit 11 and may reduce only common mode noise of signals at some clock frequencies. It is assumed in the present embodiment that the common mode filter 13 is intended for communication under the HDMI 2.0 standard and does not remove noise from electric signals at high-speed clock frequencies under the HDMI 2.1 standard.

The communication control circuit 11 and the common mode filter 13 are connected by a signal line 14 formed on the front surface of the printed circuit board 10. Also, the communication connector 12 and the common mode filter 13 are connected by a signal line 15. It should be noted that data communication is assumed to be carried out with an external communication device by way of four signal lines in the present embodiment, and both the signal line 14 and the signal line 15 include four parallel signal lines.

The signal lines 15 include signal lines 15a, signal lines 15b, and signal lines 15c. The signal lines 15a are formed on the front surface of the printed circuit board 10 and coupled to the common mode filter 13. The signal lines 15b are formed in the inner layer of the printed circuit board 10. The signal lines 15c are formed on the front surface of the printed circuit board 10 and coupled to the communication connector 12. The signal lines 15a and the signal lines 15b are electrically connected through vias 16a formed in the printed circuit board 10. Also, the signal lines 15b and the signal lines 15c are electrically connected through vias 16b formed in the printed circuit board 10.

When the communication control circuit 11 engages in communication at a high-speed clock frequency by way of the communication connector 12, noise is emitted into surroundings. The present inventors et al. have found out, as a result of a study made by simulations and measurements, that a reflected wave arising from reflection of an electric signal (traveling wave), transmitted from the communication control circuit 11, by the common mode filter 13 has a significant impact on noise as a whole. Therefore, it is possible to suppress occurrence of noise by arranging the common mode filter 13 as described above in such a manner as to reduce the impact of the reflected wave caused by the common mode filter 13.

Specifically, it is possible to suppress the occurrence of noise by keeping the communication control circuit 11 and the common mode filter 13 at a distance which is determined commensurate with a magnitude of the clock frequency that generates noise. Conversely, the distance from the common mode filter 13 to the communication connector 12 has a relatively small impact on the occurrence of noise and can therefore be determined relatively freely in consideration of circuit design convenience and the like.

In particular, it is possible to produce such resonance that causes a traveling wave and a reflected wave to cancel out each other by setting an electrical length Le at which a reflected wave by the common mode filter 13 produces resonance to an integer multiple of a wavelength λ corresponding to the clock frequency that requires a countermeasure against noise (i.e., an even multiple of λ/2), thereby suppressing external noise emission. Here, the electrical length Le is expressed by √ε·D where D is a physical distance of a signal path that contributes to the resonance of the reflected wave and ε is a dielectric constant of a dielectric included in the printed circuit board 10. Accordingly, emitted noise can be suppressed in a case where the distance D is close to D=(1/√ε)n·λ.

Here, n is an integer equal to or greater than 1.

Figure 3:
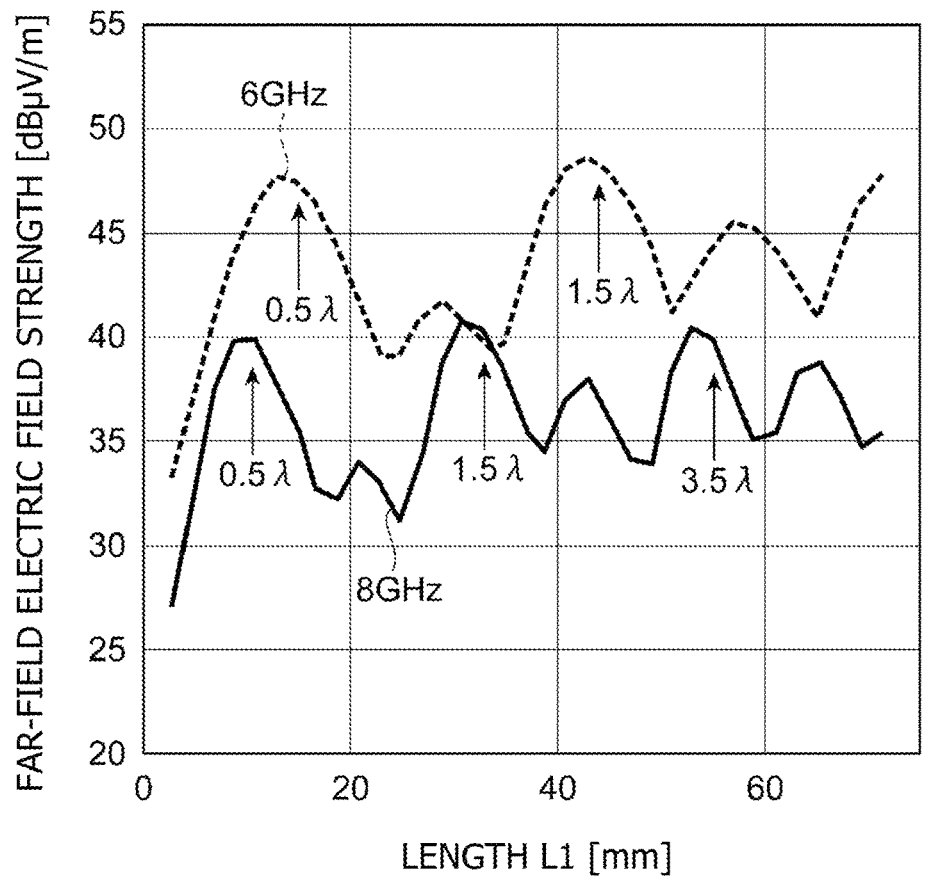
FIG. 3 is a graph illustrating an effect of a position of a common mode filter on noise.

FIG. 3 illustrates simulation results of cases where a length L1 of the signal lines 15 from the communication control circuit 11 to the common mode filter 13 is varied. The graph in this figure illustrates simulation results of a case where the clock frequency is 6 GHz and a case where the clock frequency is 8 GHz, the horizontal axis represents the length L1 of the signal lines 15 between the communication control circuit 11 and the common mode filter 13, and the vertical axis represents a magnitude of a far-field electric field strength. The greater the electric field strength, the greater the size of noise caused by communication of the communication control circuit 11. As illustrated in this figure, the size of noise varies periodically commensurate with the variation of the length L1, and the period thereof corresponds to the wavelengths λ of the respective clock frequencies. More specifically, noise peaks appear at positions where the electrical length corresponds to odd multiples of λ/2.

The graph illustrating the simulation results in FIG. 3 indicates that the far-field electric field strength takes on a minimum value at a position where the length L1 is close to 0. However, the present inventors et al. have confirmed that the size of noise decreases not at the position where the length L1 becomes 0 but at a farther position in an actual device unlike the simulation results. The reason for this is that it is assumed that not only the signal lines 14 up to the common mode filter 13 outside the communication control circuit 11 but also an internal package structure of the communication control circuit 11 not considered in the above simulations contribute to resonance between the communication control circuit 11 and the common mode filter 13.

A die inside the communication control circuit 11 is connected to connection terminals outside the communication control circuit 11 by wiring (wires) such as wire bonding. The die and the wires presumably contribute to resonance between a traveling wave and a reflected wave. However, it is difficult to identify the size of the die and the wiring length inside the communication control circuit 11. Accordingly, the position of the common mode filter 13 is determined in consideration of the wiring length inside the communication control circuit 11 which is assumed on the basis of the physical size of the communication control circuit 11.

Specifically, the distance D at which the reflected wave from the common mode filter 13 produces resonance is a sum of the length L1 of the signal lines 15 and a length L2 of a signal path inside the communication control circuit 11, and the electrical length Le is √ε times the distance D.

$$Le=\sqrt{\varepsilon}(L1+L2)$$

It is possible to reduce the occurrence of noise in a case where the electrical length Le is closer to an even multiple of λ/2 than to an odd multiple of λ/2. That is, in a case where the following relational formula is satisfied where n is an integer equal to or greater than 1, emitted noise is reduced more than in other cases.

$$n\cdot\lambda-\lambda/4<\sqrt{\varepsilon}(L1+L2)<n\cdot\lambda+\lambda/4$$

This relational formula indicates that a difference between the electrical length Le and the length of an even multiple of λ/2 is smaller than λ/4.

More preferably, emitted noise is reduced by satisfying the following relational formula.

$$n \cdot \lambda - \lambda/8 < \sqrt{\varepsilon}(L1+L2) < n \cdot \lambda + \lambda/8$$

This relational formula indicates that the difference between the electrical length Le and the length of an even multiple of $\lambda/2$ is smaller than $\lambda/8$.

In these formulas, $\lambda$ is the wavelength corresponding to the clock frequency that requires a countermeasure against noise of all the clock frequencies of the electric signal sent out from the communication control circuit 11. In particular, this $\lambda$ may be the wavelength corresponding to the maximum clock frequency (8 GHz in the present embodiment) of the electric signal sent out from the communication control circuit 11. Also, in a case where a countermeasure against noise is required for clock frequencies lower than this (e.g., 6 GHz), it is also possible to suppress noise during communication in both clock frequencies by determining the position of the common mode filter 13 in a manner satisfying the above relational formula also for the second wavelength corresponding to that clock frequency.

Figure 4:
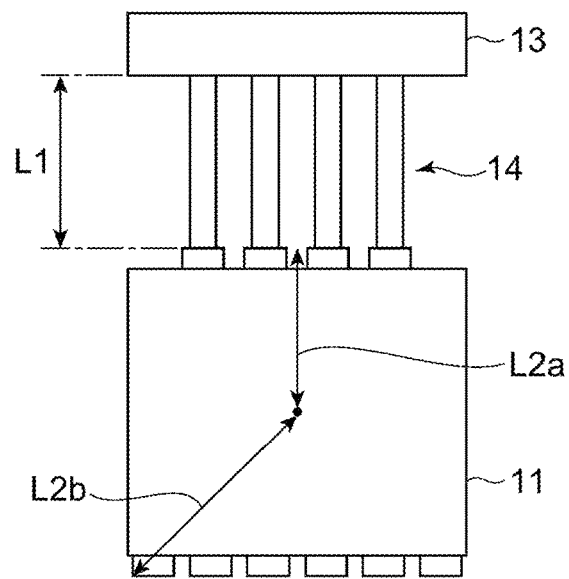
FIG. 4 is a diagram describing a relation between the position of the common mode filter and an electrical length.

Although, here, L2 is the length of the signal path inside the communication control circuit 11, the length as described below may be approximately regarded as L2 in a case where the internal structure of the communication control circuit 11 is unknown. Specifically, the electrical length Le is calculated by regarding, as the length L2, a sum of a distance L2a from a center position of the communication control circuit 11 to a side to which the signal lines 15 are connected and a distance L2b from the center position to the farthest connection terminal on an opposite side of the signal lines 15. FIG. 4 is a diagram describing the length L2 and the distance D at which resonance is produced in this case.

The shielding member 20 includes a plate-shaped conductive member such as a metallic plate and is arranged to be opposed to the printed circuit board 10 and cover the circuit elements arranged on the front surface of the printed circuit board 10. An outer edge of the shielding member 20 is electrically connected to the ground pattern G formed on the front surface of the printed circuit board 10. This allows the shielding member 20 to prevent noise generated inside the shielding member 20 from being propagated externally.

As has been described so far, the communication control circuit 11 and the common mode filter 13 are connected by the signal lines 14, and the signal lines 14 are arranged on the front surface of the printed circuit board 10. Accordingly, there is no signal path that moves between layers of the printed circuit board 10 between the communication control circuit 11 and the common mode filter 13.

Meanwhile, the signal lines 15 between the common mode filter 13 and the communication connector 12 include, halfway therethrough, the signal lines 15b that are formed inside the printed circuit board 10. Accordingly, the signal lines 15 connect the layers through the vias formed in the printed circuit board 10 at both ends of the signal lines 15b. The present inventors et al. have found out that, in a case where there are such signal paths that connect the layers, noise is likely to leak from those portions. Accordingly, no interlayer connection point is provided in a communication path between the common mode filter 13 which is a main noise emission source and the communication control circuit 11, and such an interlayer connection point is provided in a communication path between the common mode filter 13 and the communication connector 12.

The outer edge of the shielding member 20 intersects, in plan view, the signal lines 15b that pass through the internal layer. This makes it possible to bring the outer edge of the shielding member 20 in contact with the ground pattern G on the front surface of the printed circuit board 10 without causing the signal path between the communication control circuit 11 and the communication connector 12 to interrupt the ground pattern G. This makes it possible for the shielding member 20 to accommodate the communication control circuit 11, the common mode filter 13, and the signal lines 14 connecting them and prevent noise emitted from these elements from being propagated externally.

As has been described above, according to the communication device 1 according to the present embodiment, it is possible to effectively suppress noise caused by a reflected wave of an electric signal sent out from the communication control circuit 11 to the common mode filter 13 and prevent emission of large noise in a case where the communication control circuit 11 engages in communication by using a high-speed clock.

It should be noted that embodiments of the present invention are not limited to that described above. For example, although it has been stated in the above description that the communication control circuit 11 engages in communication in accordance with the HDMI standards, the present invention is not limited thereto, and the communication control circuit 11 may be a circuit that engages in communication in accordance with various communication standards. Also, although it has been stated in the above description that the maximum clock frequency of signals sent and received between the communication control circuit 11 and the communication connector 12 is 8 GHz, the present invention is not limited thereto, and the communication control circuit 11 may engage in communication at various clock frequencies. In this case, it is only necessary to determine the position of the common mode filter 13 so as to provide an electrical length close to an integer multiple of the wavelength $\lambda$ corresponding to the clock frequency that requires a countermeasure against noise (in particular, the maximum clock frequency used by the communication control circuit 11 to send and receive signals).

Also, although it has been stated in the above description that the communication device 1 is a home gaming machine, the communication device 1 according to the embodiment of the present invention is not limited thereto and may be various devices having the communication control circuit 11 and the communication connector 12 for engaging in wired communication such as a personal computer, a portable gaming machine, and a smartphone.

REFERENCE SIGNS LIST

1: Communication device
10: Printed circuit board
11: Communication control circuit
12: Communication connector
13: Common mode filter
14, 15: Signal line
16: Via
20: Shielding member

The invention claimed is:

1. A communication device comprising:
a communication connector;
a communication control circuit adapted to control communication that is established by way of the communication connector;
a common mode filter connected to each of the communication control circuit and the communication connector to relay the communication; and one or more first signal lines connecting the communication control circuit and the common mode filter, wherein;

a wavelength corresponding to a clock frequency of an electric signal sent out from the communication control circuit is denoted as $\lambda$, an electrical length of the one or more first signal lines at which resonance is produced by a reflected wave resulting from reflection of the electric signal by the common mode filter is closer to an even multiple of $\lambda/2$ than to an odd multiple thereof.

2. The communication device according to claim 1, wherein a difference between the electrical length of the one or more first signal lines and the length of an even multiple of $\lambda/2$ is smaller than $\lambda/8$.

3. The communication device according to claim 1, wherein the one or more signal lines connecting the communication control circuit and the common mode filter are arranged on a front surface of a printed circuit board, and one or more signal lines connecting the common mode filter and the communication connector include a path that runs between layers of the printed circuit board.

4. The communication device according to claim 1, further comprising:

one or more second signal lines connecting the common mode filter and the communication connector, wherein an electrical length of the one or more second signal lines at which resonance is produced by a reflected wave resulting from reflection of the electric signal by the common mode filter is not constrained to be closer to an even multiple of $\lambda/2$ than to an odd multiple thereof.

* * * * *